(12) United States Patent
Lu et al.

(10) Patent No.: US 6,788,757 B1
(45) Date of Patent: Sep. 7, 2004

(54) BI-DIRECTIONAL SHIFT-REGISTER CIRCUIT

(75) Inventors: Shi-Hsiang Lu, Taipei (TW); Jian-Shen Yu, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/454,893

(22) Filed: Jun. 5, 2003

(51) Int. Cl.$^7$ .............................................. G11C 19/00
(52) U.S. Cl. ........................................ 377/69; 377/80
(58) Field of Search ...................................... 377/69, 80

(56) References Cited

U.S. PATENT DOCUMENTS 4,284,953 A * 8/1981 Hepworth et al. ............. 377/75
5,282,234 A   1/1994 Murayama et al. ........... 377/69

FOREIGN PATENT DOCUMENTS

JP          07-013513     1/1995

* cited by examiner

Primary Examiner—Margaret Wambach
(74) Attorney, Agent, or Firm—Ladas & Parry

(57) ABSTRACT

A bi-directional shift-register circuit for outputting data in different sequence. A first shift-register unit includes a first-stage control terminal and a first-stage output terminal outputs a first output signal. A second shift-register unit includes a second-stage input terminal coupled to the first-stage output terminal and a third-stage output terminal, a second-stage control terminal and a second-stage output terminal outputs a second output signal. The second-stage control terminal is selectively coupled to the first-stage output terminal and the third-stage output terminal and disables the second shift-register unit according to the first output signal or a third output signal. A third shift-register unit includes a third-stage control terminal and the third-stage output terminal outputs the third output signal. A switching circuit connects the third-stage output terminal with the second-stage control terminal when receiving the forward-scan control signal, and connects the first-stage output terminal with the second-stage control terminal upon receiving the backward-scan control signal.

10 Claims, 6 Drawing Sheets

BI-DIRECTIONAL SHIFT-REGISTER CIRCUIT

BACKGROUND OF THE INVENTION

1. Field of the Invention

The present invention relates in general to a shift-register circuit. In particular, the present invention relates to a bi-directional shift-register circuit for driving a liquid crystal display.

2. Description of the Related Art

A frame of a liquid crystal display (LCD) is generated by a plurality of pixels in a matrix. Thus, sequential pulses are basic signals driving the LCD. In addition, the sequential pulses are generated by a shift-register circuit, thus the shift register circuit is a general unit for the driving circuit of an LCD.

FIG. 1 shows a conventional shift-register circuit. Only three stages of shift-register units are shown in FIG. 1 and a plurality of shift-register units comprise a shift-register circuit. The input signals of the (N−1)th-stage shift-register unit 100 are the output signal (N−2)OUT of the (N−2)th-stage shift-register unit and the output signal (N)OUT of the (N)th-stage shift-register unit 102. The input signals of the (N)th-stage shift-register unit 102 are the output signal (N−1)OUT of the (N−1)th-stage shift-register unit 100 and the output signal (N−1)OUT of the (N−1)th-stage shift-register unit 104. The input signals of the (N−1)th-stage shift-register unit 104 are the output signal (N)OUT of the (N)th-stage shift-register unit 102 and the output signal (N−2)OUT of the (N+2)th-stage shift-register unit. In addition, the adjacent shift-register units receive inverted clock signals (CK or CK*). Accordingly, each shift-register unit operates in response to the output signal of the pre-stage shift-register unit and the next-stage shift-register unit and outputs data according to the voltage-level of the clock signal.

FIG. 2 shows a timing chart of the conventional shift-register unit. The output of the shift-register unit 100 is labeled (N−1)OUT, the output of the shift-register unit 102 is labeled (N)OUT and the output of the shift-register unit 104 is labeled (N+1)OUT. The data output from each shift-register unit is delayed by a half clock period. Thus, the requirement of the shift-register circuit is achieved.

However, a single sequence does not satisfy the requirement of LCD products. For example, some displays of digital cameras are rotated according to the placement angle of the camera. In addition, some LCD monitors provide a monitor rotation function so LCD displays with different scanning sequences are required. Therefore, a shift-register circuit with different signal output sequences is also required.

U.S. Pat. No. U.S. 5,894,296 (Maekawa 1999) discloses a bi-directional signal transmission network and bi-directional signal transfer shift register.

SUMMARY OF THE INVHNTZON

The object of the present invention is to provide another a bi-directional shift-register circuit comprising a plurality of shift-register units connected in serial. Each shift-register unit is connected to the pre-stage and the next stage shift-register unit. The direction of the data output sequence of the shift-register circuit is switched by controlling the switches and the control gate of the shift-register units.

To achieve the above-mentioned object, the present invention provides a bi-directional shift-register circuit comprising thin film transistors for outputting data in different turns according to a forward-scan control signal and a backward-scan control signal output by a scanning-sequence control circuit. The first shift-register unit with first-stage input terminal, a first-stage control terminal, and a first-stage output terminal outputs a first output signal. The second shift-register unit with second-stage input terminal coupled to the first-stage output terminal and a third-stage output terminal, a second-stage control terminal and a second-stage output terminal outputs a second output signal. The second-stage control terminal is selectively coupled to one first-stage output terminal and the third-stage output terminal and disables the second shift-register unit according to one first output signal and a third output signal. The third shift-register unit with third-stage input terminal, a third-stage control terminal, and a third-stage output terminal that outputs the third output signal. The switching circuit is coupled to the scanning-sequence control circuit for connecting the third-stage output terminal with the second-stage control terminal when receiving the forward-scan control signal, and connecting the first-stage output terminal with the second-stage control terminal when receiving the backward-scan control signal.

In addition, the present invention provides another bi-directional shift-register circuit having a plurality of shift-register units connected in serial for a clock signal, an inverse clock signal and a ground level. The or OR-logic gate receives signals output by output terminals of a pre-stage shift-register unit and a next-stage shift-register unit, respectively, and outputs an or-gate logic signal. The PMOS transistor includes a first gate, a first drain and a first source coupled to the or-gate logic signal. The first inverter is coupled between the first source and the first gate. The first NMOS transistor includes a second gate coupled to the first gate, a second drain coupled to the first drain and a second source. The switching circuit selectively outputs the signals of the output terminals of the pre-stage shift-register unit and the next-stage shift-register unit. The second inverter inverts the output signals. The AND-logic gate is coupled to the first drain and the second inverter for outputting an and-gate logic signal. The second NMOS transistor includes a third gate coupled to the AND-logic gate, a third drain coupled to the clock signal and a third source. The capacitor is coupled between the third gate and the third source. The third NMOS transistor includes a fourth gate coupled to the third gate, a fourth drain coupled to the inverse clock signal and a fourth source. The fourth NMOS transistor includes a fifth gate coupled to the first source, a fifth drain coupled to the third source and a fifth source coupled to the ground level. The fifth NMOS transistor includes a sixth gate coupled to the fourth source, a sixth drain coupled to the second source and a sixth source coupled to the ground level. The third inverter is coupled to the third source to output an inverted output signal. The fourth inverter is coupled to the third inverter to output the output signal.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
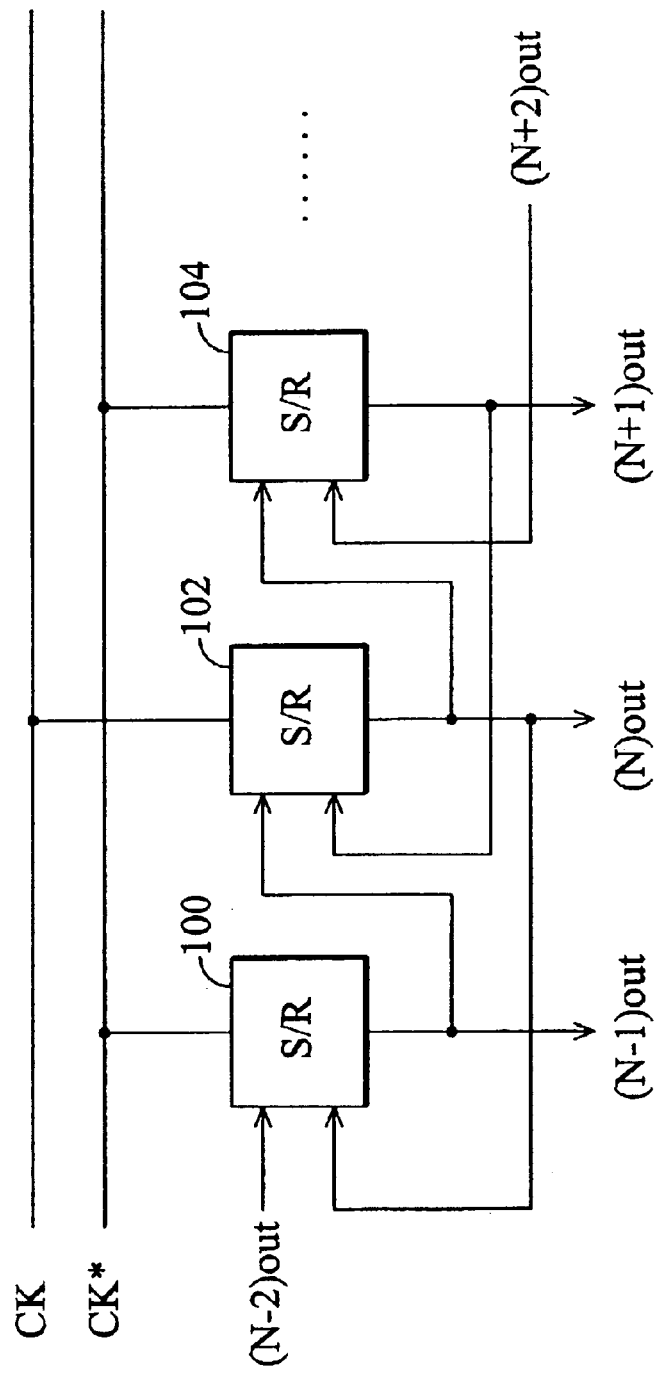
FIG. 1 shows a conventional shift-register circuit of an LCD.
Figure 2:
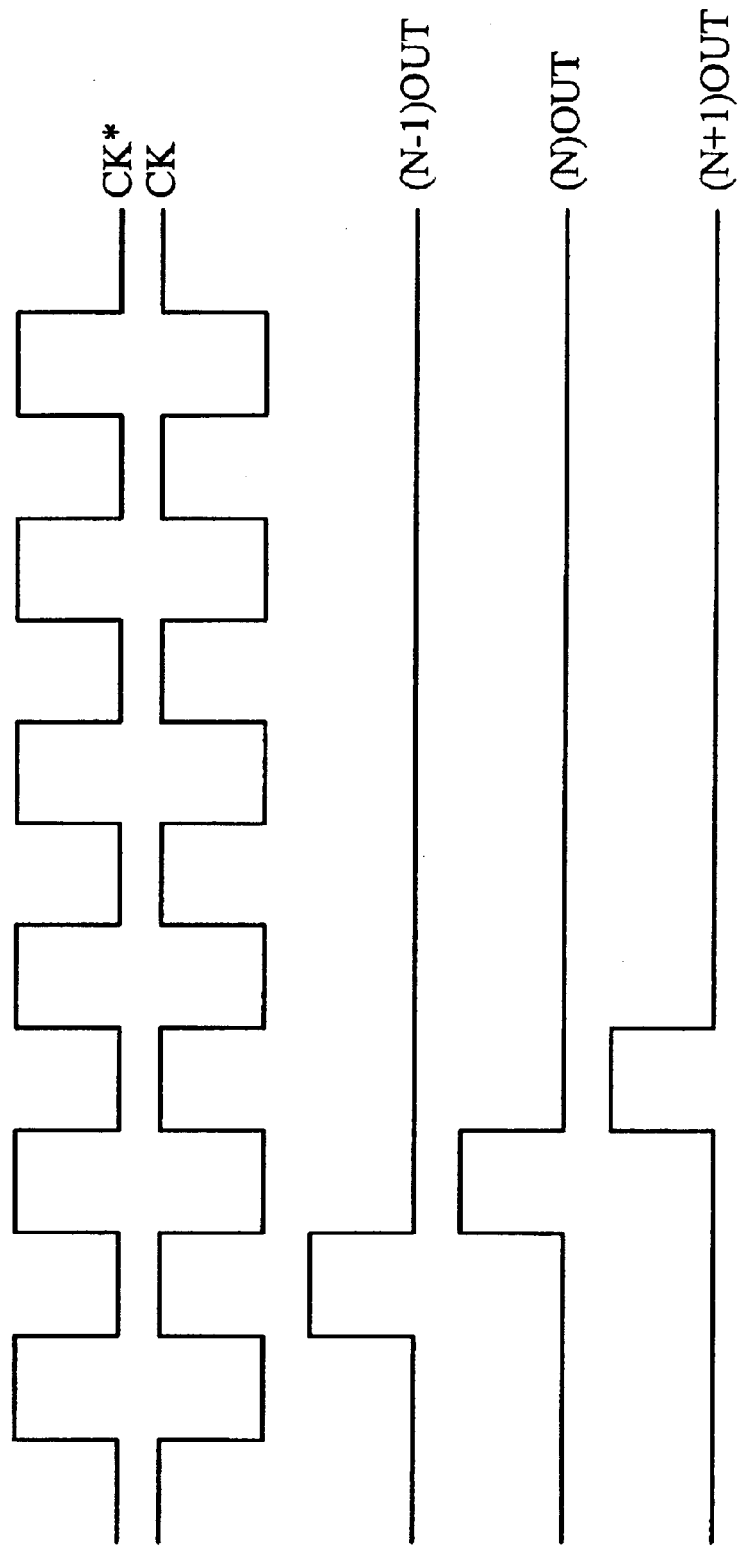
FIG. 2 shows a timing chart of the output of the conventional shift-register circuit.
Figure 3A:
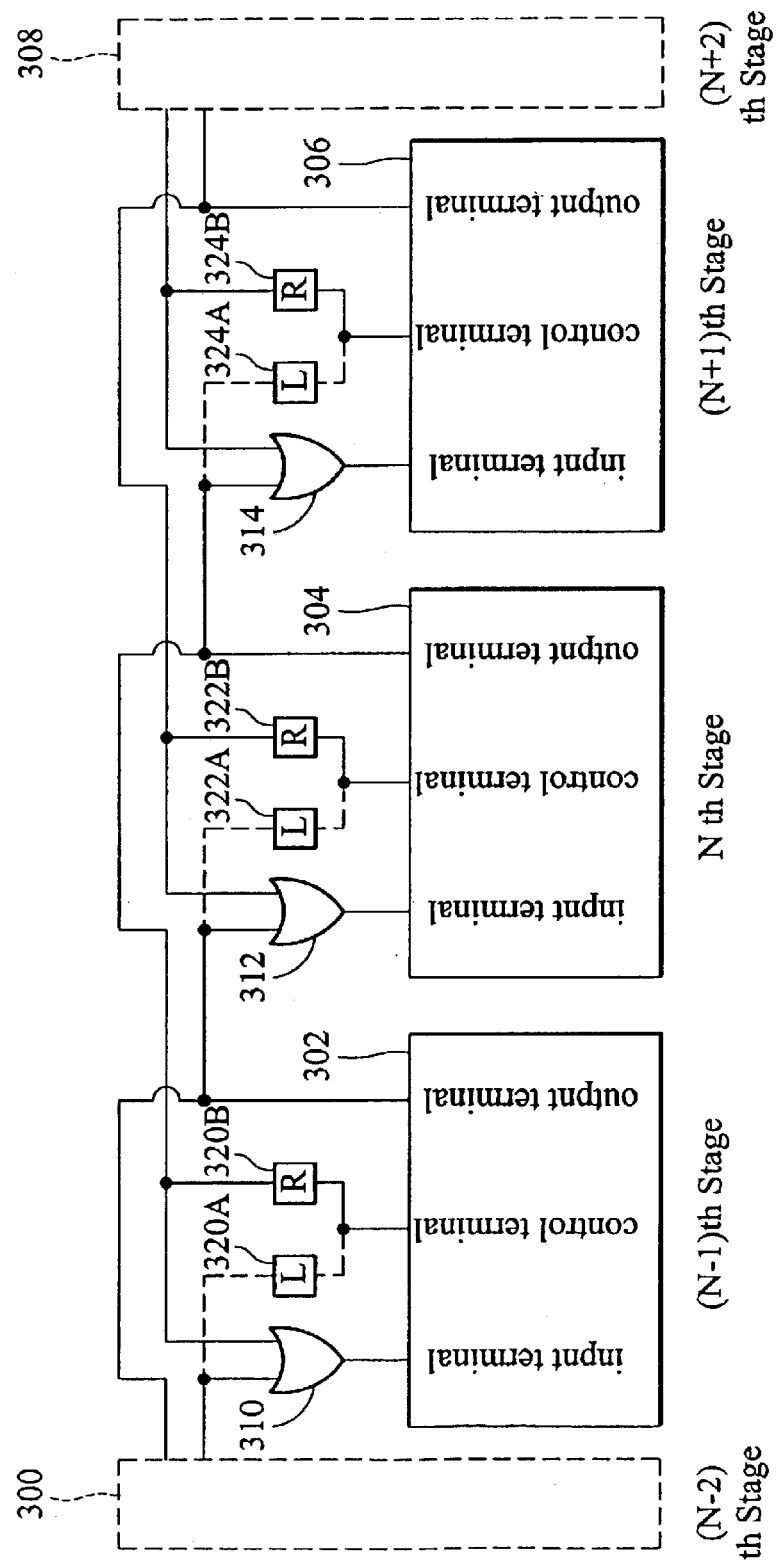
FIGS. 3A and 3B show circuits of the bi-directional shift-register circuit according to the embodiment of the present invention.
Figure 3B:
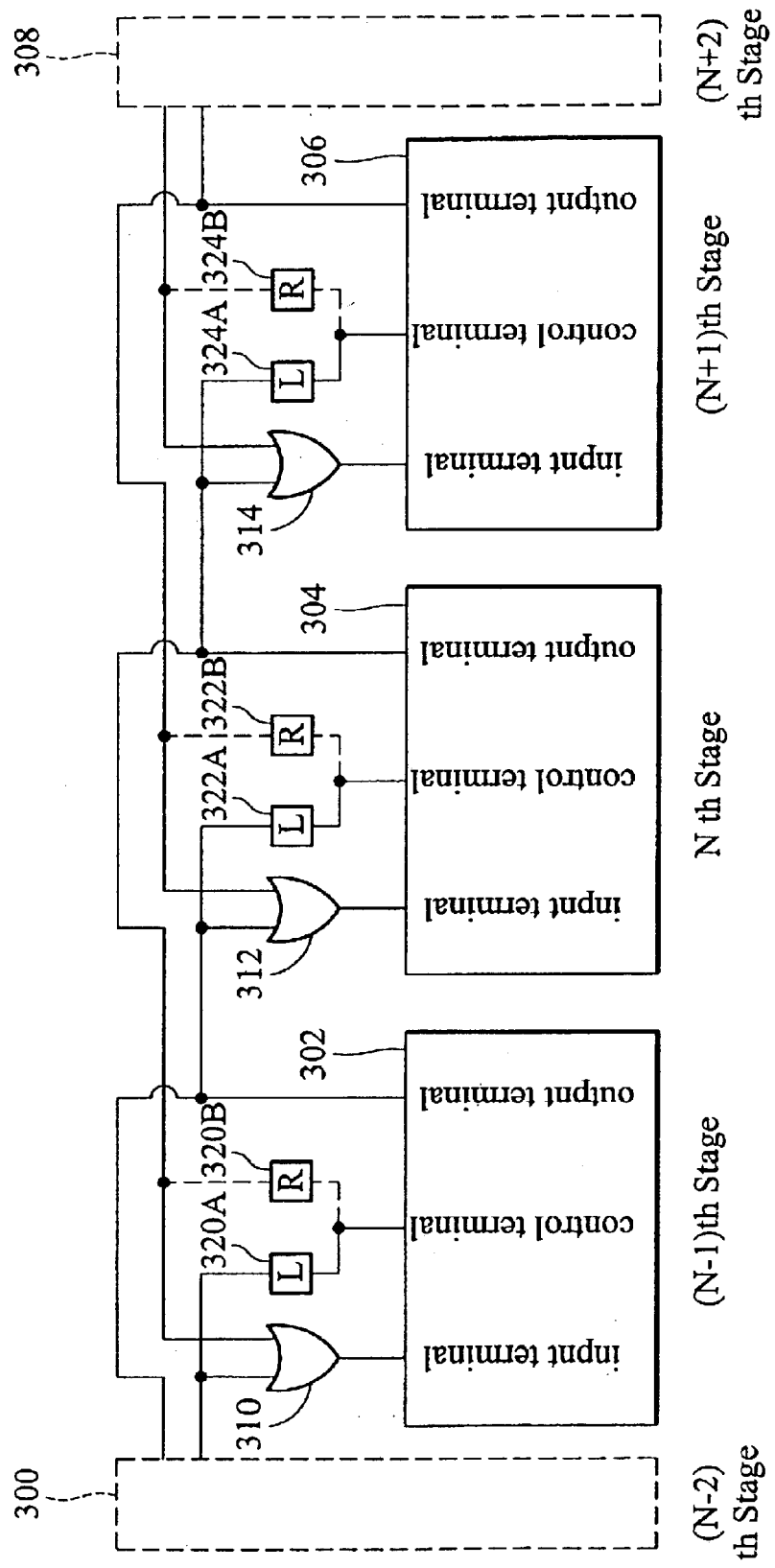

FIGS. 3A and 3B show circuits of the bi-directional shift-register circuit according to the embodiment of the present invention. Only three stages of shift-register units are shown in FIGS. 3A and 3B, and a plurality of shift-register units connected in serial comprise a shift-register circuit. The dotted lines in the figures represent an open connection.

In FIG. 3A, the signal received by the input terminal of the (N−1)th-stage shift-register unit 302 is output from the OR-logic gate 310 after performing logic operations on the output signals output from the output terminals of the (N−2)th-stage shift-register unit 300 and the (N)th-stage shift-register unit 304. The signal received by the input terminal of the (N)th-stage shift-register unit 304 is output from the OR-logic gate 312 after performing logic operations on the output signals output from the output terminals of the (N−1)th-stage shift-register unit 302 and the (N+1)th-stage shift-register unit 306. In addition, the signal received by the input terminal of the (N+1)th-stage shift-register unit 306 is output from the OR-logic gate 314 after performing logic operations on the output signals output from the output terminals of the (N)th-stage shift-register unit 304 and the (N+2)th-stage shift-register unit 308.

In addition, the control terminal of each shift-register unit is connected to the output terminals of the pre-stage or the next stage shift-register unit through switches. For example, the control gate of the (N)th-stage shift-register unit 304 is connected to the output terminals of the (N−1)th-stage shift-register unit 302 and the (N+1)th-stage shift-register unit 306 through the switches 322A and 322B, respectively.

The switching circuit comprises switches 320A~324A and 320B~324B. The switching of the switches is controlled by a scanning sequence control circuit (not shown). The switches in one switch group comprising the switches 320A~324A or 320B~324B are turned on according to the forward-scan control signal and the backward-scan control signal provided by the scanning sequence control circuit. Here, the switches can be the transmission gates composed by a PMOS transistor and an NMOS transistor having drains and sources connected to each other.

In FIGS. 3A and 3B, a first transmission gate 320A and a second transmission gate 320B are respectively coupled between the input terminal of the (N−1)th stage (first-stage) and the control terminal of the (N−1)th stage, and the output terminal of the Nth stage (second-stage) and the control terminal of the (N−1)th stage. A third transmission gate 322A and a fourth transmission gate 322B are respectively coupled between the input terminal of the Nth stage and the control terminal of the Nth stage, and the output terminal of the (N+1)th stage (third-stage) and the control terminal of the Nth stage. A fifth transmission gate 324A and a sixth transmission gate 324B are respectively coupled between the input terminal of the (N+1)th stage and the control terminal of the (N+1)th stage, and a output terminal of (N+2)th stage (fourth-stage) of a fourth shift-register unit 380 and the control terminal of the (N+1)th stage. Here, dotted lines in FIGS. 3A and 3B represent the connections turned off by the transmission gates thereon. the (N−1)th-stage, shift-register unit 302, the (N)th-stage shift-register unit 304 and the (N+1)th-stage shift-register unit 306. Alternately, the switches 320A~320A are turned on and the switches 320B~320B are turned off when the scanning sequence control circuit provides the forward-scan control signal. Thus, the shift-register circuit outputs signal in the scan sequences of the (N+1)th-stage shift-register unit 306, the (N)th-stage shift-register unit 304 and the (N−1)th-stage shift-register unit 302.

As shown in FIG. 3A, when the (N+1)th-stage shift-register unit 306 outputs the signal to the (N+2)th-stage shift-register unit 308, the signal is also output to the input terminal and control terminal of the (N)th-stage shift-register unit 304. Here, the circuit of the control terminal of the (N)th-stage shift-register unit 304 processes the received signal to avoid interference with the received signal by the operation of the (N)th-stage shift-register unit 304.

Figure 4:
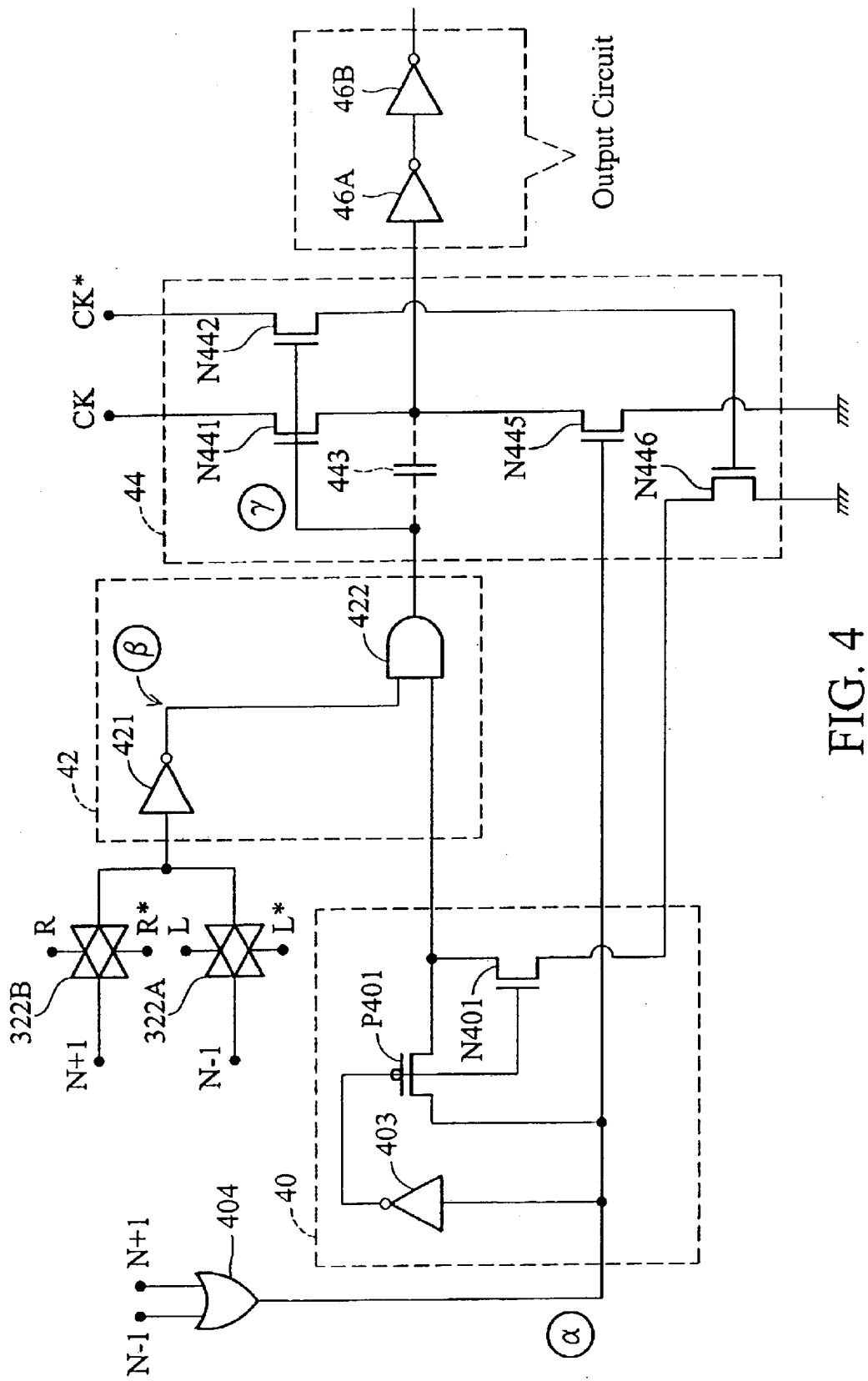
FIG. 4 shows the circuit of the shift-register unit according to the embodiment of the present invention.

The circuit of the shift-register unit is now described FIG. 4, shows the circuit of the shift-register unit according to the embodiment of the present invention. The input circuit 40 comprises the PMOS transistor P401, the NMOS transistor N401 and the inverter 403. The inverter 403 is coupled between the gate and the source of the PMOS transistor P401. The source of the PMOS transistor P401 is coupled to the logic output terminal of the OR-logic gate 404. The input terminal of the OR-logic gate 404 receives the signals output from the pre-stage and the next-stage shift-register unit. The gates and the drains of the PMOS transistor P401 and the NMOS transistor N401 are connected to each other.

The control circuit 42 comprises an inverter 421 and an AND-logic gate 422. Using the shift-register unit 304 in FIG. 3A as an example, the output terminal of the inverter 421 is connected to the switches 322A and 322B. The input terminal of the AND-logic gate 422 is connected to the connection point of the drains of the PMOS transistor P401 and the NMOS transistor N401 and the output terminal of the inverter 421.

The circuit of the buffer circuit 44 is described in the following. The gate of the NMOS transistor N441 is coupled to the output terminal of the AND-logic gate 422, and its drain is coupled to the clock signal CK. The capacitor 443 is coupled between the gate and the source of the NMOS transistor 441. Here, the capacitor can be generated by the parasitic capacitor of the NMOS transistor 441 or provided by an external capacitor. The gate of the NMOS transistor 442 is coupled to the gate of the NMOS transistor N441 and its drain is coupled to the clock signal CK*. Here, the clock signals CK and CK* are inverted.

The gate of the NMOS transistor N445 is coupled to the source of the PMOS transistor P401, its drain is coupled to the source of the NMOS transistor N441 and its source is connected to the ground. The gate of the NMOS transistor N446 is coupled to the source of the NMOS transistor N442, its drain is coupled to the source of the NMOS transistor N401 and its source is coupled to the ground. The inverter 46A is an inverse output terminal coupled to the drain of the NMOS transistor N445 for outputting an inverse output signal. The inverter 46B is an output terminal coupled to the inverter 46A for outputting an output signal of the shift-register unit.

The operation of the shift-register unit according to the embodiment of the present invention is described in the following. First, one of the switches 322A and 322B is turned on. As mentioned above, the switch 322A is turned off when the switch 322B is turned on. Thus, the shift-register circuit outputs signal in the scan sequences of the (N−1)th-stage shift-register unit 302, the (N)th-stage shift-register unit 304 and the (N+1)th-stage shift-register unit 306. Alternately, the switch 322A is turned on when the switch 322B is turned off. Thus, the shift-register circuit outputs signal in the scan sequence of the (N+1)th-stage shift-register unit 306, the (N)th-stage shift-register unit 304 and the (N−1)th-stage shift-register unit 302. Thus, the requirement of the shift-register circuit output signals in different scan sequences is also achieved by controlling the state of the switches.

When the switch 322B is turned on, the shift-register circuit outputs signal in the turns of the (N−1)th-stage shift-register unit 302, the (N)th-stage shift-register unit 304 and the (N+1)th-stage shift-register unit 306. At this time, the OR-logic gate 404 outputs a high voltage-level signal when the OR-logic gate 404 of the N−th shift-register unit receives the signal output from the (N−1)th shift-register unit. Thus, the source of the PMOS transistor P401 receives the high voltage-level signal and the gate of the PMOS transistor P401 receives a low voltage-level signal output from the inverter 403. Thus, the PMOS transistor P401 is turned on and outputs a high voltage-level signal from its drain. In addition, the inverter 421 outputs a high voltage-level signal because the switch 322B is turned on and low voltage-level signal is output by the next-stage shift-register unit. Thus, the inverter 421 and the drain of the PMOS transistor P401 output high voltage-level signals to the AND-logic gate 422, and the AND logic gate 422 outputs a high voltage-level signal to charge the capacitor.

Figure 5:
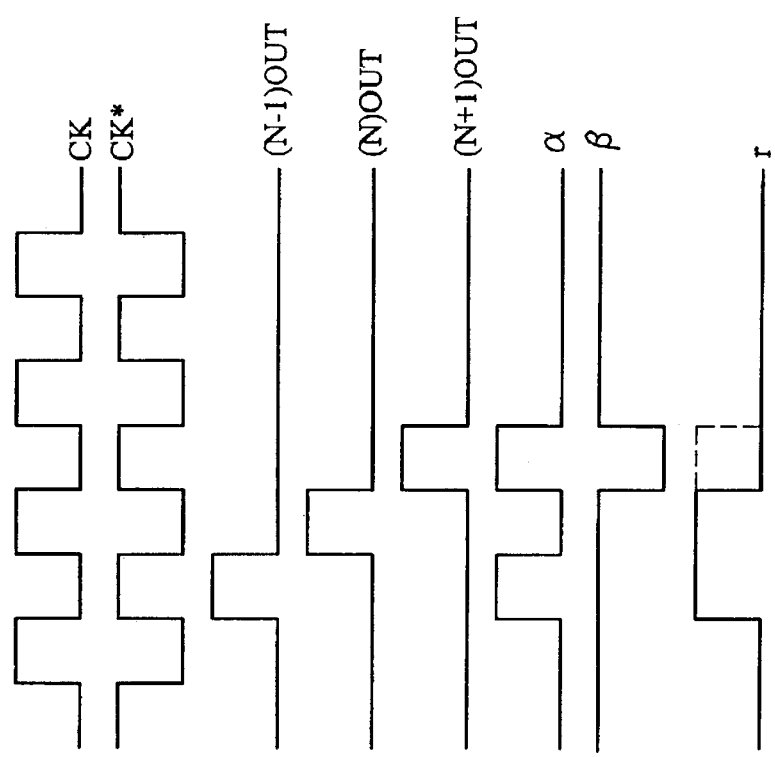
FIG. 5 shows a timing chart of the bi-directional shift-register circuit according to the embodiment of the present invention.

FIG. 5 is a timing chart of the shift-register circuit according to the embodiment of the present invention. At this point in the procedure, the transistors N441 and N445 are turned on, and the clock signal CK is at a low voltage-level. Thus, one terminal of the capacitor 443 connected to the connection point of the transistors N441 and N445 is at a low voltage-level, and the voltage-level of the other terminal of the capacitor 443 continues to increase. Thus, a voltage difference is generated between both terminals of the capacitor 443.

Next, when the output signal output by the pre-stage shift-register unit, which is the (N−1)th stage, is at a low voltage-level and the next-stage shift-register unit, (N−1)th stage has not yet output a high voltage signal, the OR-logic gate 404 outputs a low voltage-level signal to the source of the PMOS transistor P401. Here,the gate of the PMOS transistor P401 receives a high voltage-level signal. Thus, the PMOS transistor P401 and the NMOS transistor N445 are turned off. However, the voltage difference between the capacitor 443 turns on the NMOS transistors N441 and N442.

When the clock signal CK is at a high voltage-level and the NMOS transistor N441 is turned on, the inverter 46A outputs low voltage-level signal and the inverter 46B outputs high voltage-level signal to enable the next-stage shift-register unit. In addition, the clock signal CK is at a low voltage-level, so the NMOS transistor N446 is turned off. Thus, even when the NMOS transistor N401 is turned on, the voltage difference between the capacitor 443 does not decrease.

Next the next-stage shift-register unit, (N+1) stage, is enabled, which outputs a high voltage-level signal to the inverter 421 through the switch 322B and the inverter 421 outputs a low voltage-level signal, thus, the AND-logic gate 422 outputs a low voltage-level signal to discharge the capacitor 443. Therefore, the output terminal 46B of the shift-register unit becomes a low voltage-level. In FIG. 5, the labels α, β and γ show the voltage-level variation at the terminals labeled α, β and γ in FIG. 4.

In FIG. 5, the output of the shift-register unit 302 is labeled (N−1)OUT, the output of the shift-register unit 304 is labeled (N)OUT and the output of the shift-register unit 306 is labeled (N+1)OUT. As shown in FIG. 5, each shift-register unit of the shift-register circuit according to the embodiment of the present invention outputs a pulse after the previous stage shift-register unit outputs a pulse in a half clock period. In addition, FIG. 5 only shows the shift-register circuit according to the embodiment of the present invention as it outputs data in a predetermined sequence. The shift-register circuit according to the embodiment of the present invention, however, outputs data in a reversed pre-determined order by changing the turned on switches of the switch circuit. Thus, the requirement of the shift-register circuit is achieved, and the requirement of the shift-register circuit output signals in different sequence is also achieved.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A bi-directional shift-register circuit comprising thin film transistors for outputting data in different sequence according to a forward-scan control signal and a backward-scan control signal output by a scanning-sequence control circuit, comprising:

a first shift-register unit with a first-stage input terminal, a first-stage control terminal, and a first-stage output terminal for outputting a first output signal;

a second shift-register unit with a second-stage input terminal coupled to the first-stage output terminal and a third-stage output terminal, a second-stage control terminal and a second-stage output terminal for outputting a second output signal, wherein the second-stage control terminal is selectively coupled to a first-stage output terminal or the third-stage output terminal and disables the second shift-register unit according to a first output signal or a third output signal;

a third shift-register unit with a third-stage input terminal, a third-stage control terminal and the third-stage output terminal for outputting the third output signal; and a switching circuit for electrically connecting the third-stage output terminal with the second-stage control terminal when receiving the forward-scan control signal, and electrically connecting the first-stage output terminal with the second-stage control terminal when receiving the backward-scan control signal.

2. The bi-directional shift-register circuit as claimed in claim 1, further comprising:

a first logic gate having a plurality of first logic input terminals and a first logic output terminal coupled to the first-stage input terminal;

a second logic gate having a plurality of second logic input terminals coupled to the first-stage output terminal and the third-stage output terminal, and a second logic output terminal coupled to the second-stage input terminal; and a third logic gate having a plurality of third logic input terminals and a third logic output terminal coupled to the third-stage input terminal.

3. The bi-directional shift-register circuit as claimed in claim 2, wherein the first, second and third logic gates are OR-logic gates.

4. The bi-directional shift-register circuit as claimed in claim 1, wherein the data is sequentially output by the first-stage output terminal, the second-stage output terminal, and the third-stage output terminal when the switching circuit receives the forward-scan control signal.

5. The bi-directional shift-register circuit as claimed in claim 1, wherein the data is sequentially output by the third-stage output terminal, the second-stage output terminal, and the first-stage output terminal when the switching circuit receives the backward-scan control signal.

6. The bi-directional shift-register circuit as claimed in claim 1, wherein the switching circuit comprises:

a first transmission gate and a second transmission gate respectively coupled between the first-stage input terminal and the first-stage control terminal, and the second-stage output terminal and the first-stage control terminal;

a third transmission gate and a fourth transmission gate respectively coupled between the second-stage input terminal and the second-stage control terminal, and the third-stage output terminal and the second-stage control terminal; and a fifth transmission gate and a sixth transmission gate respectively coupled between the third-stage input terminal and the third-stage control terminal, and a fourth-stage output terminal of a fourth shift-register unit and the third-stage control terminal.

7. The bi-directional shift-register circuit as claimed in claim 6, wherein the second, fourth and sixth transmission gates are turned on when the switching circuit receives the forward-scan control signal.

8. The bi-directional shift-register circuit as claimed in claim 6, wherein the first, third and fifth transmission gates are turned on when the switching circuit receives the backward-scan control signal.

9. The bi-directional shift-register circuit as claimed in claim 6, wherein the first, second, third, fourth, fifth and sixth transmission gates each comprise a PMOS transistor and an NMOS transistor, respectively.

10. A bi-directional shift-register circuit having a plurality of shift-register units connected in serial for receiving a clock signal, an inverse clock signal and a ground level, each shift-register unit comprising:

an OR-logic gate for receiving output signals output by output terminals of a pre-stage shift-register unit and a next-stage shift-register unit, respectively, and outputting an OR-gate logic signal;

a PMOS transistor having a first gate, a first drain and a first source coupled to the OR-gate logic signal;

a first inverter coupled between the first source and the first gate;

a first NMOS transistor having a second gate coupled to the first gate, a second drain coupled to the first drain, and a second source;

a switching circuit for selectively outputting the output signals of the output terminals of the pre-stage shift-register unit and the next-stage shift-register unit, a second inverter for inverting the output of the switching circuit;

an AND-logic gate coupled to the first drain and the second inverter for outputting an AND-gate logic signal;

a second NMOS transistor having a third gate coupled to the AND-logic gate, a third drain coupled to the clock signal, and a third source;

a capacitor coupled between the third gate and the third source;

a third NMOS transistor having a fourth gate coupled to the third gate, a fourth drain coupled to the inverse clock signal, and a fourth source;

a fourth NMOS transistor having a fifth gate coupled to the first source, a fifth drain coupled to the third source, and a fifth source coupled to the ground level;

a fifth NMOS transistor having a sixth gate coupled to the fourth source, a sixth drain coupled to the second source, and a sixth source coupled to the ground level;

a third inverter coupled to the third source to output an inverted output signal; and a fourth inverter coupled to the third inverter to output the output signal of a current-stage shift-register unit.

* * * * *